(12) United States Patent
Zhang et al.

(10) Patent No.: US 9,323,606 B2
(45) Date of Patent: Apr. 26, 2016

(54) SYSTEMS AND METHODS FOR FAID FOLLOWER DECODING

(71) Applicant: LSI Corporation, San Jose, CA (US)

(72) Inventors: Yequn Zhang, Tucson, AZ (US); Yang Han, Sunnyvale, CA (US); Yu Chin Fabian Lim, San Jose, CA (US); Shu Li, San Jose, CA (US); Fan Zhang, Milpitas, CA (US); Shaohua Yang, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 132 days.

(21) Appl. No.: 14/101,368

(22) Filed: Dec. 10, 2013

(65) Prior Publication Data

US 2015/0143196 A1 May 21, 2015

Related U.S. Application Data

(60) Provisional application No. 61/907,170, filed on Nov. 21, 2013.

(51) Int. Cl.
| | |
|---|---|
| H03M 13/00 | (2006.01) |
| G06F 11/10 | (2006.01) |
| H03M 13/09 | (2006.01) |
| H03M 13/11 | (2006.01) |
| H03M 13/27 | (2006.01) |
| H03M 13/29 | (2006.01) |
| H03M 13/37 | (2006.01) |
| H03M 13/41 | (2006.01) |

(52) U.S. Cl.
CPC ............ *G06F 11/1008* (2013.01); *H03M 13/09* (2013.01); *H03M 13/1111* (2013.01); *H03M 13/27* (2013.01); *H03M 13/2957* (2013.01); *H03M 13/3707* (2013.01); *H03M 13/3723* (2013.01); *H03M 13/3746* (2013.01); *H03M 13/6331* (2013.01); *H03M 13/6343* (2013.01); *H03M 13/6594* (2013.01); *H03M 13/41* (2013.01)

(58) Field of Classification Search
CPC ........................ G06F 11/1008; H03M 13/09
See application file for complete search history.

(56) References Cited

U.S. PATENT DOCUMENTS

| | | | |
|---|---|---|---|
| 4,553,221 | A | 11/1985 | Hyatt |
| 4,805,174 | A | 2/1989 | Kubota |

(Continued)

FOREIGN PATENT DOCUMENTS

| | | | |
|---|---|---|---|
| JP | 2001/319433 A | | 11/2001 |
| WO | WO 2010/059264 A1 | | 5/2010 |
| WO | WO 2010/126482 A1 | | 11/2010 |

OTHER PUBLICATIONS

Cai et al. Low Complexity finite alphabet iterative decoders for LDPC codes IEEE international symposium on circuits and systems May 19-23, 2013 pp. 1332-1335.*

(Continued)

*Primary Examiner* — Sam Rizk

(57) ABSTRACT

Systems and method relating generally to data processing, and more particularly to systems and methods for decoding information. Some disclosed systems include a first data decoding circuit, a second data decoding circuit, and a data output circuit. The second data decoding circuit is coupled to the first data decoding circuit and the data output circuit. The second data decoding circuit is operable to apply a finite alphabet iterative decoding algorithm to the first decoded output to yield a second decoded output.

20 Claims, 6 Drawing Sheets

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,351,274 A | 9/1994 | Chennakeshu |
| 5,392,299 A | 2/1995 | Rhines |
| 5,406,593 A | 4/1995 | Chennakeshu |
| 5,417,500 A | 5/1995 | Martinie |
| 5,450,253 A | 9/1995 | Seki |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,696,504 A | 12/1997 | Oliveros |
| 5,710,784 A | 1/1998 | Kindred |
| 5,717,706 A | 2/1998 | Ikeda |
| 5,719,871 A | 2/1998 | Helm |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccalissister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,175,588 B1 | 1/2001 | Visotsky |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,393,074 B1 | 5/2002 | Mandyam |
| 6,412,088 B1 | 6/2002 | Patapoutian et al. |
| 6,473,878 B1 | 10/2002 | Wei |
| 6,535,553 B1 | 3/2003 | Limberg et al. |
| 6,625,775 B1 | 9/2003 | Kim |
| 6,643,814 B1 | 11/2003 | Cideciyan et al. |
| 6,697,441 B1 | 2/2004 | Bottomley |
| 6,747,827 B1 | 6/2004 | Bassett et al. |
| 6,748,034 B2 | 6/2004 | Hattori |
| 6,757,862 B1 | 6/2004 | Marianetti, II |
| 6,785,863 B2 | 8/2004 | Blankenship |
| 6,807,238 B1 | 10/2004 | Rhee |
| 6,810,502 B2 | 10/2004 | Eidson |
| 6,839,774 B1 | 1/2005 | Ahn et al. |
| 6,948,113 B1 | 9/2005 | Shaver |
| 6,970,511 B1 | 11/2005 | Barnette |
| 6,975,692 B2 | 12/2005 | Razzell |
| 6,986,098 B2 | 1/2006 | Poeppelman |
| 7,035,327 B2 | 4/2006 | Nakajima et al. |
| 7,047,474 B2 | 5/2006 | Rhee |
| 7,058,853 B1 | 6/2006 | Kavanappillil et al. |
| 7,058,873 B2 | 6/2006 | Song et al. |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,136,244 B1 | 11/2006 | Rothberg |
| 7,184,486 B1 | 2/2007 | Wu |
| 7,191,378 B2 | 3/2007 | Eroz |
| 7,203,887 B2 | 4/2007 | Eroz |
| 7,230,550 B1 | 6/2007 | Mittal |
| 7,237,181 B2 | 6/2007 | Richardson |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,596,196 B1 | 9/2009 | Liu et al. |
| 7,646,829 B2 | 1/2010 | Ashley |
| 7,702,986 B2 | 4/2010 | Bjerke |
| 7,738,202 B1 | 6/2010 | Zheng |
| 7,752,523 B1 | 7/2010 | Chaichanavong |
| 7,779,325 B2 | 8/2010 | Song |
| 7,802,172 B2 | 9/2010 | Vila Casado et al. |
| 7,952,824 B2 | 5/2011 | Dziak |
| 7,957,251 B2 | 6/2011 | Ratnakar Aravind |
| 7,958,425 B2 | 6/2011 | Chugg |
| 7,996,746 B2 | 8/2011 | Livshitz |
| 8,018,360 B2 | 9/2011 | Nayak |
| 8,020,069 B1 | 9/2011 | Feng |
| 8,020,078 B2 | 9/2011 | Richardson |
| 8,161,361 B1 | 4/2012 | Song et al. |
| 8,201,051 B2 | 6/2012 | Tan |
| 8,225,168 B2 | 7/2012 | Yu et al. |
| 8,237,597 B2 | 8/2012 | Liu |
| 8,255,765 B1 | 8/2012 | Yeo |
| 8,261,171 B2 | 9/2012 | Annampedu |
| 8,291,284 B2 | 10/2012 | Savin |
| 8,291,299 B2 | 10/2012 | Li et al. |
| 8,295,001 B2 | 10/2012 | Liu |
| 8,296,637 B1 | 10/2012 | Varnica |
| 8,370,711 B2 | 2/2013 | Alrod |
| 8,381,069 B1 | 2/2013 | Liu |
| 8,413,032 B1 | 4/2013 | Song |
| 8,429,498 B1 | 4/2013 | Anholt |
| 8,443,267 B2 | 5/2013 | Zhong et al. |
| 8,458,555 B2 | 6/2013 | Gunnam |
| 8,464,142 B2 | 6/2013 | Gunnam et al. |
| 8,495,462 B1 | 7/2013 | Liu |
| 8,516,339 B1 | 8/2013 | Lesea |
| 8,527,849 B2 | 9/2013 | Jakab |
| 8,560,900 B1 | 10/2013 | Bellorado |
| 2001/0010089 A1 | 7/2001 | Gueguen |
| 2001/0016114 A1 | 8/2001 | Van Gestel et al. |
| 2002/0021519 A1 | 2/2002 | Rae |
| 2002/0067780 A1 | 6/2002 | Razzell |
| 2002/0168033 A1 | 11/2002 | Suzuki |
| 2003/0031236 A1 | 2/2003 | Dahlman |
| 2003/0123364 A1 | 7/2003 | Nakajima et al. |
| 2003/0126527 A1 | 7/2003 | Kim et al. |
| 2003/0138102 A1 | 7/2003 | Kohn et al. |
| 2003/0147168 A1 | 8/2003 | Galbraith et al. |
| 2003/0188252 A1 | 10/2003 | Kim |
| 2004/0042436 A1 | 3/2004 | Terry et al. |
| 2004/0194007 A1 | 9/2004 | Hocevar |
| 2004/0228021 A1 | 11/2004 | Yamazaki |
| 2004/0264284 A1 | 12/2004 | Priborsky et al. |
| 2005/0047514 A1 | 3/2005 | Bolinth |
| 2005/0149842 A1 | 7/2005 | Kyung |
| 2005/0210367 A1 | 9/2005 | Ashikhmin |
| 2005/0243456 A1 | 11/2005 | Mitchell et al. |
| 2006/0002689 A1 | 1/2006 | Yang et al. |
| 2006/0159355 A1 | 7/2006 | Mizuno |
| 2006/0195730 A1 | 8/2006 | Kageyama |
| 2007/0185902 A1 | 8/2007 | Messinger et al. |
| 2007/0234178 A1 | 10/2007 | Richardson |
| 2007/0297496 A1 | 12/2007 | Park et al. |
| 2008/0037676 A1 | 2/2008 | Kyun et al. |
| 2008/0069373 A1 | 3/2008 | Jiang |
| 2008/0140686 A1 | 6/2008 | Hong |
| 2008/0304558 A1 | 12/2008 | Zhu et al. |
| 2009/0003301 A1 | 1/2009 | Reial |
| 2009/0092174 A1 | 4/2009 | Wang |
| 2009/0106633 A1 | 4/2009 | Fujiwara |
| 2009/0125780 A1 | 5/2009 | Taylor |
| 2009/0132893 A1 | 5/2009 | Miyazaki |
| 2009/0150745 A1 | 6/2009 | Langner et al. |
| 2009/0177852 A1 | 7/2009 | Chen |
| 2009/0185643 A1 | 7/2009 | Fitzpatrick |
| 2009/0216942 A1 | 8/2009 | Yen |
| 2009/0273492 A1 | 11/2009 | Yang et al. |
| 2010/0077276 A1 | 3/2010 | Okamura et al. |

(56) References Cited

U.S. PATENT DOCUMENTS

| | | | |
|---|---|---|---|
| 2010/0088575 A1* | 4/2010 | Sharon | G06F 11/1072 714/763 |
| 2010/0150252 A1 | 6/2010 | Camp | |
| 2010/0172046 A1 | 7/2010 | Liu et al. | |
| 2010/0241921 A1 | 9/2010 | Gunam | |
| 2010/0268996 A1 | 10/2010 | Yang | |
| 2010/0322048 A1 | 12/2010 | Yang et al. | |
| 2010/0325511 A1 | 12/2010 | Oh | |
| 2011/0041040 A1 | 2/2011 | Su | |
| 2011/0043938 A1 | 2/2011 | Mathew | |
| 2011/0066768 A1 | 3/2011 | Brittner et al. | |
| 2011/0167227 A1 | 7/2011 | Yang | |
| 2011/0167246 A1* | 7/2011 | Yang et al. | 712/233 |
| 2011/0258508 A1 | 10/2011 | Ivkovic | |
| 2011/0264987 A1 | 10/2011 | Li | |
| 2011/0307760 A1 | 12/2011 | Pisek | |
| 2011/0320902 A1 | 12/2011 | Gunnam | |
| 2012/0020402 A1 | 1/2012 | Ibing | |
| 2012/0038998 A1 | 2/2012 | Mathew | |
| 2012/0063023 A1 | 3/2012 | Mathew | |
| 2012/0079353 A1 | 3/2012 | Liikanen | |
| 2012/0124118 A1 | 5/2012 | Ivkovic | |
| 2012/0182643 A1 | 7/2012 | Zhang | |
| 2012/0185744 A1 | 7/2012 | Varnica | |
| 2012/0203986 A1 | 8/2012 | Strasser et al. | |
| 2012/0207201 A1 | 8/2012 | Xia | |
| 2012/0212849 A1 | 8/2012 | Xu | |
| 2012/0236428 A1 | 9/2012 | Xia et al. | |
| 2012/0262814 A1 | 10/2012 | Li | |
| 2012/0265488 A1 | 10/2012 | Sun | |
| 2012/0317462 A1 | 12/2012 | Liu et al. | |
| 2013/0024740 A1 | 1/2013 | Xia | |
| 2013/0031440 A1 | 1/2013 | Sharon | |
| 2013/0120169 A1 | 5/2013 | Li | |
| 2013/0173983 A1* | 7/2013 | Chung et al. | 714/752 |
| 2013/0194955 A1 | 8/2013 | Chang | |
| 2013/0198580 A1 | 8/2013 | Chen | |
| 2013/0238955 A1 | 9/2013 | D'Abreu | |
| 2013/0254616 A1 | 9/2013 | Yang | |
| 2013/0254619 A1 | 9/2013 | Zhang | |

OTHER PUBLICATIONS

Casado et al., Multiple-rate low- density parity-check codes with constant blocklength, IEEE Transations on communications, Jan. 2009, vol. 57, pp. 75-83.

Cul et al., "High-Throughput Layered LDPC Decoding Architecture", IEEE Transactions on Very Large Scale Integration (VLSI) Systems, vol. 17, No. 4 (Apr. 2009).

Dolecek "Analysis of Absorbing Sets and Fully Absorbing Sets of Array-Based LDPC Codes" IEEE Trans. Information Theory, vol. 56 No. 1/10.

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive Mmse Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Patapoutian et al "Improving Re-Read Strategies by Waveform Averaging" IEEE Transactions on Mag. vol. 37 No. 6, Nov. 2001.

Planjery et al "Finite Alphabet Iterative Decoders, pt 1: Decoding Beyond Beliver Propogation on BSC" 7/12, printed from the internet Apr. 21, 2014 http://arxiv.org/pdf/1207.4800.pd.

Richardson, T "Error Floors of LDPC Codes" Flarion Technologies Bedminster NJ 07921, tjr@flarion.com (not dated).

Shokrollahi "LDPC Codes: An Introduction", Digital Fountain, Inc. (Apr. 2, 2003).

Spagnol et al, "Hardware Implementation of GF(2Am) LDPC Decoders", IEEE Transactions on Circuits and Systemssi: Regular Papers, Vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/300,078, filed Nov. 18, 2011, Chung-Li Wang, Unpublished.

U.S. Appl. No. 13/269,832, filed Oct. 10, 2011, Haitao Xia, Unpublished.

U.S. Appl. No. 13/227,544, filed Sep. 8, 2011, Shaohua Yang, Unpublished.

U.S. Appl. No. 14/025,104, filed Sep. 12, 2013, Bruce Wilson, Unpublished.

U.S. Appl. No. 13/186,234, filed Jul. 19, 2011, Haitao Xia, Unpublished.

U.S. Appl. No. 13/545,833, filed Jul. 10, 2012, Zhi Bin Li, Unpublished

U.S. Appl. No. 13/327,279, filed Dec. 15, 2011, Wei Feng, Unpublished.

U.S. Appl. No. 13/340,974, filed Dec. 30, 2011, Dan Liu, Unpublished.

U.S. Appl. No. 13/445,848, filed Apr. 12, 2012, Bruce Wilson, Unpublished.

U.S. Appl. No. 13/340,951, filed Dec. 30, 2011, Lei Chen, Unpublished.

U.S. Appl. No. 13/369,468, filed Feb. 9, 2012, Zongwang Li, Unpublished.

U.S. Appl. No. 13/171,615, filed Jun. 29, 2011, Bradley D. Seago, Unpublished.

U.S. Appl. No. 13/180,495, filed Jul. 11, 2011, Chung-Li Wang, Unpublished.

U.S. Appl. No. 13/302,119, filed Nov. 22, 2011, Lei Chen, Unpublished.

U.S. Appl. No. 13/305,510, filed Nov. 28, 2011, Lei Chen, Unpublished.

U.S. Appl. No. 13/227,416, filed Sep. 7, 2011, Lei Chen, Unpublished.

U.S. Appl. No. 13/305,551, filed Nov. 28, 2011, Yang Han, Unpublished.

U.S. Appl. No. 13/296,022, filed Nov. 14, 2011, Victor Krachkovsky, Unpublished.

(56) References Cited

OTHER PUBLICATIONS

U.S. Appl. No. 13/445,878, filed Apr. 12, 2012, Yu Liao, Unpublished.
U.S. Appl. No. 13/174,537, filed Jun. 30, 2011, Anantha Raman Krishnan, Unpublished.
U.S. Appl. No. 13/174,453, filed Jun. 30, 2011, Johnson Yen, Unpublished.
U.S. Appl. No. 13/284,767, filed Oct. 28, 2011, Fan Zhang, Unpublished.
U.S. Appl. No. 13/239,683, filed Sep. 22, 2011, Changyou Xu, Unpublished.
U.S. Appl. No. 13/283,549, filed Oct. 27, 2011, Wu Chang, Unpublished.
U.S. Appl. No. 13/853,711, filed Mar. 29, 2013, Shu Li, Unpublished.
U.S. Appl. No. 13/426,693, filed Mar. 22, 2012, Shaohua Yang, Unpublished.
U.S. Appl. No. 13/652,012, filed Oct. 15, 2012, Fan Zhang, Unpublished.
U.S. Appl. No. 13/316,741, filed Dec. 12, 2011, Yang Han, Unpublished.
U.S. Appl. No. 13/766,911, filed Feb. 14, 2013, Shaohua Yang, Unpublished.
U.S. Appl. No. 13/213,751, filed Aug. 19, 2011, Fan Zhang, Unpublished.
U.S. Appl. No. 13/766,891, filed Feb. 14, 2013, Shu Li, Unpublished.
U.S. Appl. No. 13/875,357, filed May 2, 2013, Shaohua Yang, Unpublished.
U.S. Appl. No. 13/945,787, filed Jul. 18, 2013, Shu Li, Unpublished.
U.S. Appl. No. 13/945,777, filed Jul. 18, 2013, Shu Li, Unpublished.
U.S. Appl. No. 13/483,105, filed May 30, 2012, Xuebin Wu, Unpublished.
U.S. Appl. No. 13/868,779, filed Apr. 23, 2013, Fan Zhang, Unpublished.
U.S. Appl. No. 13/746,301, filed Jan. 21, 2013, Shu Li, Unpublished.
U.S. Appl. No. 13/918,510, filed Jun. 14, 2013, Shu Li, Unpublished.
U.S. Appl. No. 13/770,008, filed Feb. 19, 2013, Shaohua Yang, Unpublished.
U.S. Appl. No. 13/912,059, filed Jun. 6, 2013, Fan Zhang, Unpublished.
U.S. Appl. No. 13/954,573, filed Jul. 30, 2013, Kaitlyn T. Nguyen, Unpublished.
U.S. Appl. No. 14/072,604, filed Nov. 5, 2013, Shu Li, Unpublished.
U.S. Appl. No. 14/047,441, filed Oct. 7, 2013, Haitao Xia, Unpublished.
U.S. Appl. No. 14/047,319, filed Oct. 7, 2013, Shaohua Yang, Unpublished.
U.S. Appl. No. 14/026,722, filed Sep. 13, 2013, Shaohua Yang, Unpublished.
U.S. Appl. No. 13/944,966, filed Jul. 18, 2013, Fan Zhang, Unpublished.
U.S. Appl. No. 13/295,150, filed Nov. 14, 2011, Zongwang Li, Unpublished.
U.S. Appl. No. 13/422,986, filed Mar. 16, 2012, Fan Zhang, Unpublished.
U.S. Appl. No. 13/474,660, filed May 17, 2012, Zongwang Li, Unpublished.
U.S. Appl. No. 13/433,693, filed Mar. 29, 2012, Fan Zhang, Unpublished.
U.S. Appl. No. 13/596,819, filed Aug. 28, 2012, Shaohua Yang, Unpublished.
U.S. Appl. No. 13/596,947, filed Aug. 28, 2012, Fan Zhang, Unpublished.
U.S. Appl. No. 13/426,714, filed Mar. 22, 2012, Shaohua Yang, Unpublished.
U.S. Appl. No. 13/412,520, filed Mar. 5, 2012, Fan Zhang, Unpublished.
U.S. Appl. No. 13/483,100, filed May 30, 2012, Fan Zhang, Unpublished.
U.S. Appl. No. 13/362,409, filed Jan. 31, 2012, Fan Zhang, Unpublished.
U.S. Appl. No. 13/372,580, filed Feb. 14, 2012, Fan Zhang, Unpublished.
U.S. Appl. No. 13/284,730, filed Oct. 28, 2011, Fan Zhang, Unpublished.
U.S. Appl. No. 13/596,978, filed Aug. 28, 2012, Fan Zhang, Unpublished.
U.S. Appl. No. 13/597,001, filed Aug. 28, 2012, Fan Zhang, Unpublished.
U.S. Appl. No. 13/619,907, filed Sep. 14, 2012, Fan Zhang, Unpublished.
U.S. Appl. No. 13/621,341, filed Sep. 17, 2012, Shaohua Yang, Unpublished.
U.S. Appl. No. 13/989,583, filed Oct. 15, 2012, Shaohua Yang, Unpublished.
U.S. Appl. No. 13/269,852, filed Oct. 10, 2011, Haitao Xia, Unpublished.
U.S. Appl. No. 13/113,219, filed May 23, 2011, Yang Han, Unpublished.
U.S. Appl. No. 13/415,430, filed Mar. 8, 2012, Nayak Ratnakar Aravind, Unpublished.
U.S. Appl. No. 13/415,326, filed Mar. 8, 2012, Shaohua Yang, Unpublished.
U.S. Appl. No. 13/705,407, filed Dec. 5, 2012, Lingyan Sun, Unpublished.
U.S. Appl. No. 13/316,858, filed Dec. 12, 2011, Zongwang Li, Unpublished.
Vasic, B., "High-Rate Girth-Eight Codes on Rectangular Integer Lattices", IEEE Trans. Communications, vol. 52, Aug. 2004, pp. 1248-1452.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISS06 (retrieved on Dec. 5, 2012).
Yeo et al., "VLSI Architecture for Iterative Decoders in Magnetic Storage Channels", Mar. 2001, pp. 748-55, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhao, "Effects of Clipping and Quantization on Min-Sum Algorithm and Its Modificatiaons for Decoding Low-Density Parity-Check Codes" Thesis, Carleton University.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 07.
Zhong, "Block-LDPC: A Practical LDPC Coding System Design Approach", IEEE Trans. on Circuits, Regular Papers, vol. 5, No. 4, pp. 766-775, Apr. 2005.
U.S. Appl. No. 13/426,714, filed Mar. 22, 2012, Shaohua Yang.
Cui et al., "High-Throughput Layered LDPC Decoding Architecture", IEEE Transactions on Very Large Scale Integration (VLSI) Systems, vol. 17, No. 4 (Apr. 2009).
U.S. Appl. No. 13/545,833, filed Jul. 10, 2012, Zhi Bin Li, Unpublished.
Vasic, B., "High-Rate Girth-Eight Codes on Rectangular Integer Lattices", IEEE Trans. Communications, vol. 52, Aug. 2004, pp. 1248-1252.
Zhong et al., "Quasi Cyclic LDPC Codes for the Magnetic Recording Channel: Code Design and VSLI Implementation", IEEE Transactions on Magnetics, v. 43, pp. 1118-1123, Mar. 7.

\* cited by examiner

SYSTEMS AND METHODS FOR FAID FOLLOWER DECODING

CROSS REFERENCE TO RELATED APPLICATIONS

The present application claims priority to (is a non-provisional of) U.S. Pat. App. No. 61/907,170 entitled "Systems and Methods for FAID Follower Decoding", and filed Nov. 21, 2013 by Zhang et al. The entirety of the aforementioned provisional patent application is incorporated herein by reference for all purposes.

FIELD OF THE INVENTION

Systems and method relating generally to data processing, and more particularly to systems and methods for decoding information.

BACKGROUND

Data transfers often include encoding of a data set to be transferred to yield an encoded data set, and subsequent decoding of the encoded data set to recover the original data set. The encoding typically includes the addition of information that are designed to aid in recovering data transferred via a potentially lossy medium. In some cases, the encoding and decoding fails to provide sufficient aid in recovering a transferred data set and/or wastes bandwidth by adding too much information to aid in the recovery.

Hence, for at least the aforementioned reasons, there exists a need in the art for advanced systems and methods for data processing.

SUMMARY

Systems and method relating generally to data processing, and more particularly to systems and methods for encoding and decoding information.

Some embodiments of the present invention provide data processing systems that include a first data decoding circuit and a second data decoding circuit. The first data decoding circuit is operable to apply a low density parity check decoding algorithm to a decoder input to yield a first decoded output. The second data decoding circuit is operable to apply a finite alphabet iterative decoding algorithm to the first decoded output to yield a second decoded output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
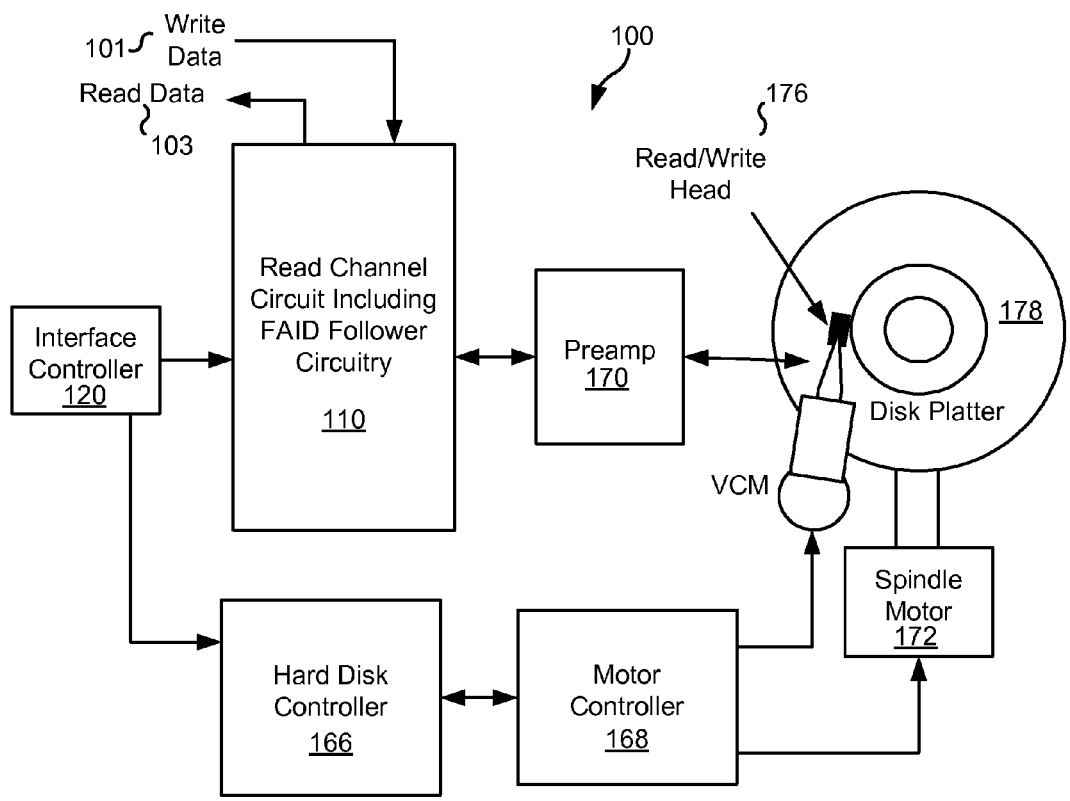
FIG. 1 shows a storage system including a read channel having FAID follower circuitry in accordance with one or more embodiments of the present invention.

Systems and method relating generally to data processing, and more particularly to systems and methods for decoding information.

It has been determined that low density parity check decoding often exhibit an error floor as signal to noise ratio increases. To address this error floor condition, some embodiments of the present invention utilize finite alphabet iterative decoder (FAID) circuit following a low density parity check decoder circuit.

Some embodiments of the present invention provide data processing systems that include a first data decoding circuit and a second data decoding circuit. The first data decoding circuit is operable to apply a low density parity check decoding algorithm to a decoder input to yield a first decoded output. The second data decoding circuit is operable to apply a finite alphabet iterative decoding algorithm to the first decoded output to yield a second decoded output. In some cases, application of the finite alphabet iterative decoding algorithm is a retry procedure that includes two decoding steps. The first is to use the normal LDPC decoding, then after the first step fails, the second one is applied on the detector output. This means we do not carry on the state at which the first decoder ends, rather, we need to restart from the detector output. In some cases, such a system is implemented as an integrated circuit. In various cases, the system is incorporated in a device selected from a group consisting of a storage device. In other cases, the system is incorporated in a communication device.

In some instances of the aforementioned embodiments, the finite alphabet iterative decoding algorithm is operable to map a variable node value into a defined map including a number of elements. In some such instances, the number of elements is a second finite number of elements, the low density parity check decoding algorithm allows a first finite number of elements, the finite alphabet iterative decoding algorithm allows the second finite number of elements; and the second finite number is less than the first finite number. In particular cases, the second finite number is less than half of the first finite number. In various cases, the first finite number is thirty-one, and the second finite number is between nine and seventeen. In one particular case, the second finite number is nine.

In various instances of the aforementioned embodiments, the defined map is generated by applying the finite alphabet iterative decoding algorithm to the collection of errors around an error floor of the first decoded output first decoded output using a first instance of the defined map to yield a first result, applying the finite alphabet iterative decoding algorithm to the collection of errors around an error floor of the first decoded output using a second instance of the defined map to yield a second result, and selecting one of the first instance of the defined map and the second instance of the defined map based upon a comparison of the first result and the second result. In one or more instances of the aforementioned embodiments, the data processing system further includes a data detector circuit operable to apply a data detection algorithm to a detector input to yield a detected output. In such instances, the decoder input is derived from the detector output. In some such instances, the data detection algorithm is a maximum a posteriori data detection algorithm. In other such instances, the data detection algorithm is a Viterbi data detection algorithm.

Other embodiments of the present invention provide methods for data processing that include: applying a low density parity check decoding algorithm by a low density parity check decoder circuit to a decoder input to yield a first decoded output; and applying a finite alphabet iterative decoding algorithm by a finite alphabet iterative decoding circuit to the collection of errors around an error floor of the first decoded output to yield a second decoded output. In some instances of the aforementioned embodiments, the finite alphabet iterative decoding algorithm is operable to map a variable node value into a defined map including a number of elements. In some such instances, the number of elements is a second finite number of elements; the low density parity check decoding algorithm allows a first finite number of elements; the finite alphabet iterative decoding algorithm allows the second finite number of elements; and the second finite number is less than the first finite number. In some cases, the first finite number is thirty-one, and wherein the second finite number is nine.

In various instances of the aforementioned embodiments, the methods further include: generating the defined map by applying the finite alphabet iterative decoding algorithm to the collection of errors around an error floor of the first decoded output using a first instance of the defined map to yield a first result, applying the finite alphabet iterative decoding algorithm to the collection of errors around an error floor of the first decoded output using a second instance of the defined map to yield a second result, and selecting one of the first instance of the defined map and the second instance of the defined map based upon a comparison of the first result and the second result. In some such instances, the second finite number is nine, and applying the finite alphabet iterative decoding algorithm to the collection of errors around an error floor of the first decoded output is repeated for 3165 different instances of the defined map to yield corresponding results, and selecting the instance associated with the best of the corresponding results. In some cases, the methods include: selecting a collection of errors around an error floor of the first decoded output, and generating the defined map by applying the finite alphabet iterative decoding algorithm to the collection of errors around the error floor of the first decoded output using a first instance of the defined map to yield a first result, applying the finite alphabet iterative decoding algorithm to the collection of errors around the error floor of the first decoded output using a second instance of the defined map to yield a second result, and selecting one of the first instance of the defined map and the second instance of the defined map based upon a comparison of the first result and the second result.

In various cases, a data processing circuit is included that includes a data detector circuit and a data decoder circuit. The data detector circuit is operable to apply a data detection algorithm to a codeword to yield a detected output, and the data decoder circuit is operable to apply a data decode algorithm to a decoder input derived from the detected output to yield a decoded output. Processing a codeword through both the data detector circuit and the data decoder circuit is generally referred to as a "global iteration". During a global iteration, the data decode algorithm may be repeated applied. Each application of the data decode algorithm during a given global iteration is referred to as a "local iteration".

Turning to FIG. 1, a storage system 100 is shown that includes a read channel 110 having FAID follower circuitry in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178, and interacts with a host controller (not shown). The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head 176 is accurately positioned by motor controller 168 over a desired data track on disk platter 178. Motor controller 168 both positions read/write head 176 in relation to disk platter 178 and drives spindle motor 172 by moving read/write head assembly 176 to the proper data track on disk platter 178 under the direction of hard disk controller 166. Spindle motor 172 spins disk platter 178 at a determined spin rate (RPMs). Once read/write head 176 is positioned adjacent the proper data track, magnetic signals representing data on disk platter 178 are sensed by read/write head 176 as disk platter 178 is rotated by spindle motor 172. The sensed magnetic signals are provided as a continuous, minute analog signal representative of the magnetic data on disk platter 178. This minute analog signal is transferred from read/write head 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

In operation, data written to disk platter 178 is encoded. The encoded data is later accessed from disk platter 178 and processed. The processing may include a variety of processing steps that are followed by applying a FAID algorithm where the earlier processing fails to converge. The data processing including application of the FAID algorithm may be done by a circuit similar to that discussed below in relation to FIGS. 4a-4b, and/or may be performed consistent with a process discussed below in relation to FIGS. 5a-5b. The map used in relation to applying the FAID algorithm may be developed using the approach discussed below in relation to FIG. 6.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
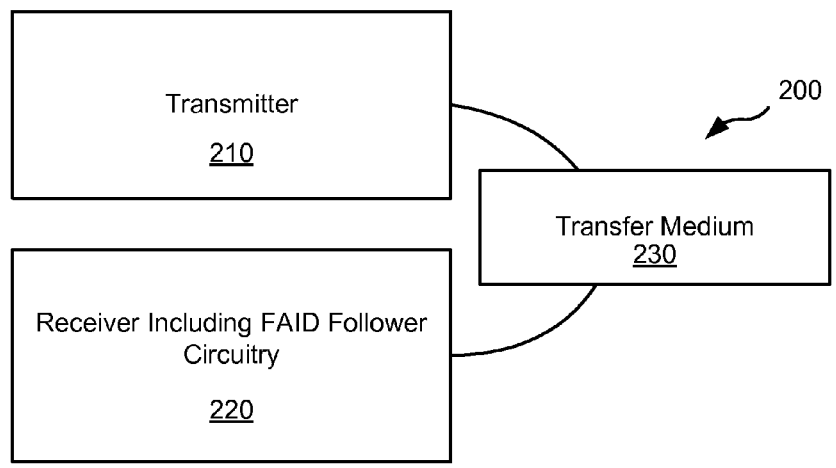
FIG. 2 shows a data transmission system including a receiver including FAID follower circuitry in accordance with one or more embodiments of the present invention.

Turning to FIG. 2, a data transmission system 200 including a receiver 220 having FAID follower circuitry in accordance with one or more embodiments of the present invention. A transmitter 210 transmits encoded data via a transfer medium 230 as is known in the art. The encoded data is received from transfer medium 230 by receiver 220.

During operation, the data received via transfer medium 230 is processed. The processing may include a variety of processing steps that are followed by applying a FAID algorithm where the earlier processing fails to converge. The data processing including application of the FAID algorithm may be done by a circuit similar to that discussed below in relation to FIGS. 4a-4b, and/or may be performed consistent with a process discussed below in relation to FIGS. 5a-5b. The map used in relation to applying the FAID algorithm may be developed using the approach discussed below in relation to FIG. 6.

Figure 3:
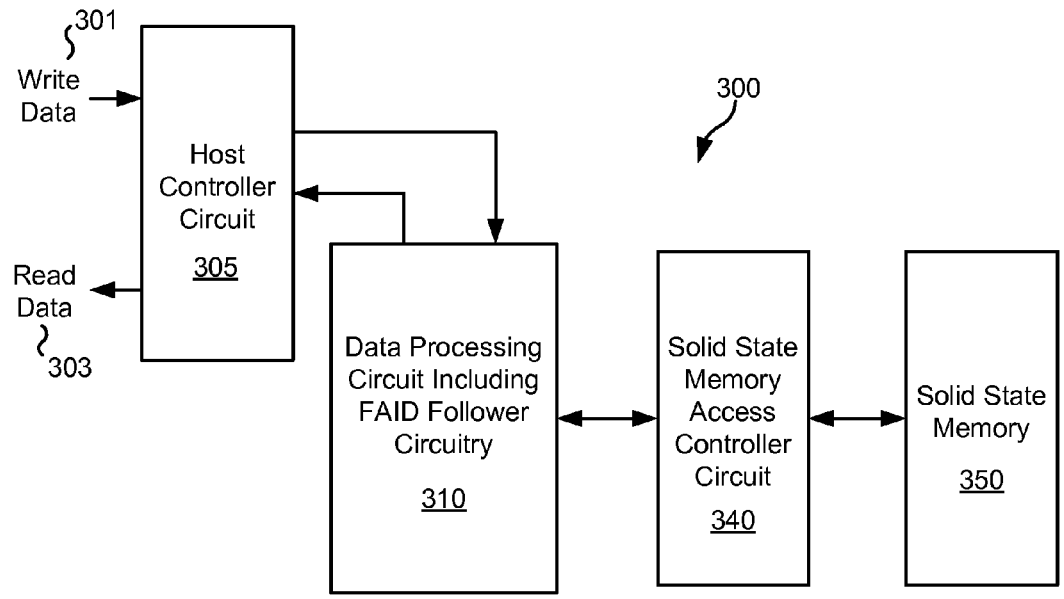
FIG. 3 shows another storage system including a data processing circuit having FAID follower circuitry in accordance with one or more embodiments of the present invention.

Turning to FIG. 3, another storage system 300 is shown that includes a data processing circuit 310 FAID follower circuitry in accordance with one or more embodiments of the present invention. A host controller circuit 305 receives data to be stored (i.e., write data 301). This data is provided to data processing circuit 310 where it is encoded. The encoded data is provided to a solid state memory access controller circuit 340. Solid state memory access controller circuit 340 may be any circuit known in the art that is capable of controlling access to and from a solid state memory. Solid state memory access controller circuit 340 formats the received encoded data for transfer to a solid state memory 350. Solid state memory 350 may be any solid state memory known in the art. In some embodiments of the present invention, solid state memory 350 is a flash memory. Later, when the previously written data is to be accessed from solid state memory 350, solid state memory access controller circuit 340 requests the data from solid state memory 350 and provides the requested data to data processing circuit 310. In turn, data processing circuit 310 processes the received data. This processing may include a variety of processing steps that are followed by applying a FAID algorithm where the earlier processing fails to converge. The data processing including application of the FAID algorithm may be done by a circuit similar to that discussed below in relation to FIGS. 4a-4b, and/or may be performed consistent with a process discussed below in relation to FIGS. 5a-5b. The map used in relation to applying the FAID algorithm may be developed using the approach discussed below in relation to FIG. 6.

Figure 4B:
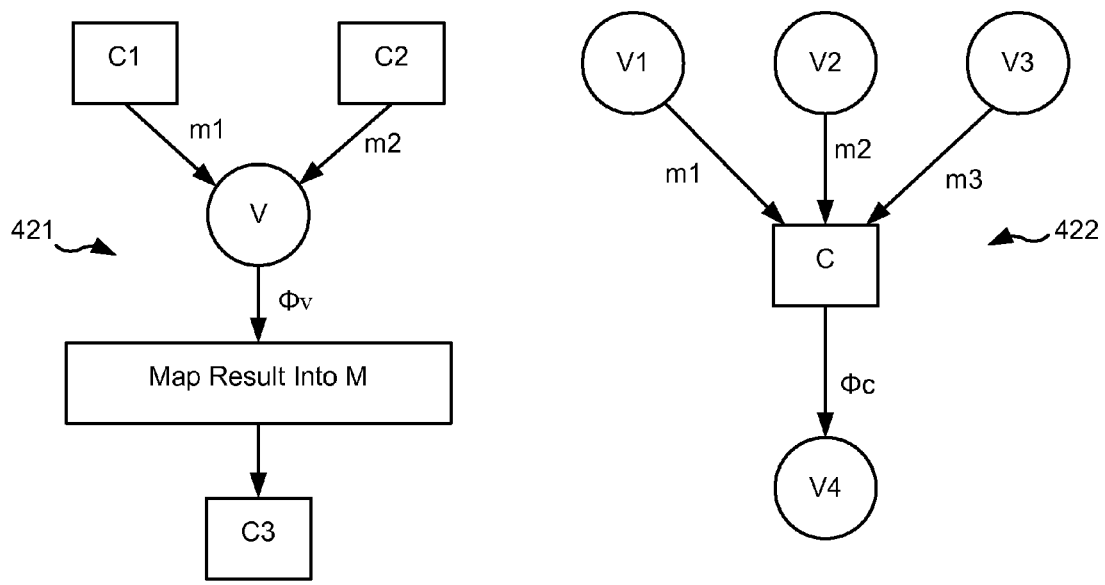
FIGS. 4a-4b depicts a data processing system including a FAID follower circuit in accordance with some embodiments of the present invention.
Figure 4A:
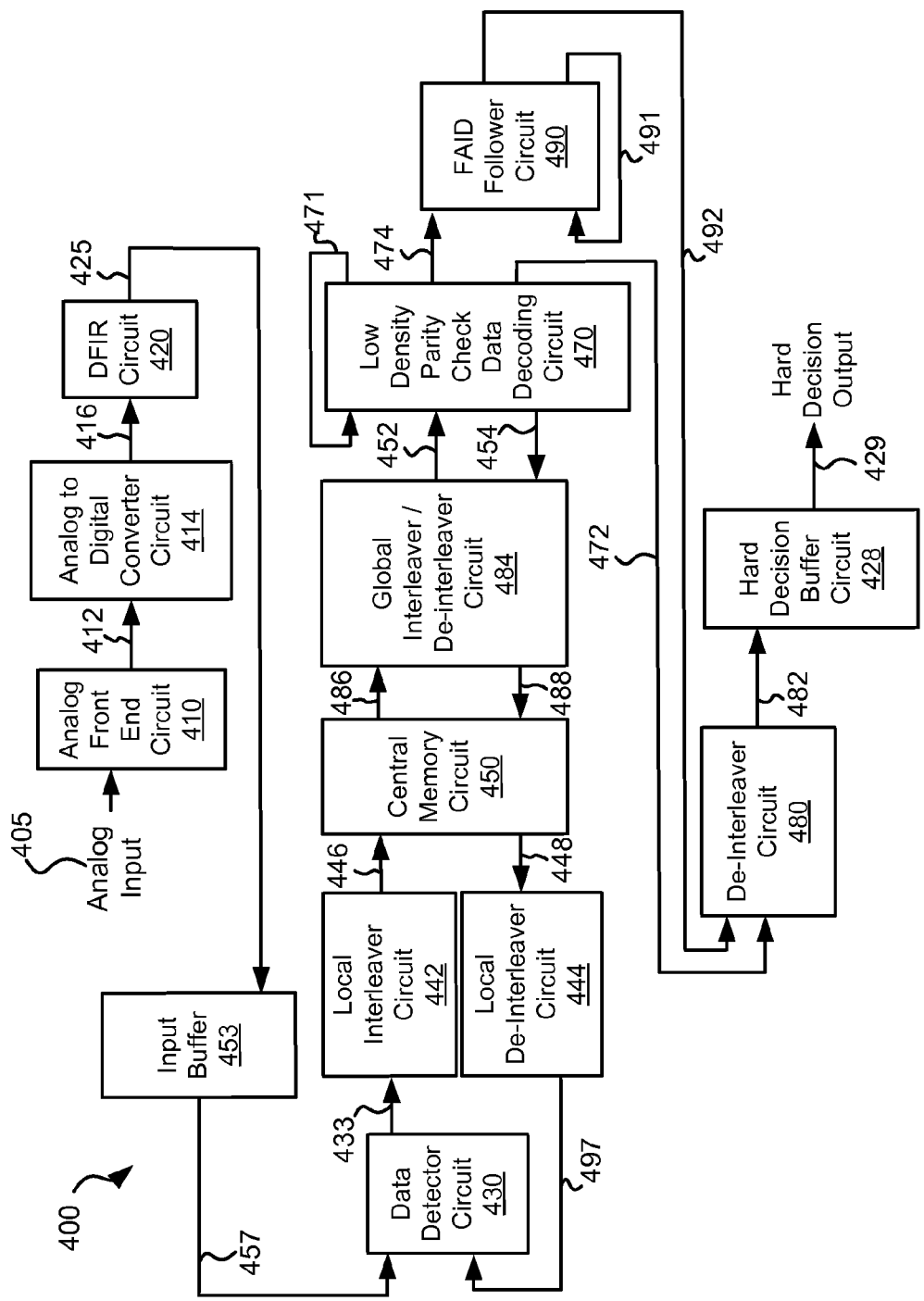

Turning to FIG. 4a, a data processing system 400 including a FAID follower circuit 490 in accordance with some embodiments of the present invention. Data processing system 400 includes an analog front end circuit 410 that receives an analog signal 405. Analog front end circuit 410 processes analog signal 405 and provides a processed analog signal 412 to an analog to digital converter circuit 414. Analog front end circuit 410 may include, but is not limited to, an analog filter and an amplifier circuit as are known in the art. Based upon the disclosure provided herein, one of ordinary skill in the art will recognize a variety of circuitry that may be included as part of analog front end circuit 410. In some cases, analog signal 405 is derived from a read/write head assembly (not shown) that is disposed in relation to a storage medium (not shown). In other cases, analog signal 405 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 405 may be derived.

Analog to digital converter circuit 414 converts processed analog signal 412 into a corresponding series of digital samples 416. Analog to digital converter circuit 414 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 416 are provided to an equalizer circuit 420. Equalizer circuit 420 applies an equalization algorithm to digital samples 416 to yield an equalized output 425. In some embodiments of the present invention, equalizer circuit 420 is a digital finite impulse response filter circuit as are known in the art. It may be possible that equalized output 425 may be received directly from a storage device in, for example, a solid state storage system. In such cases, analog front end circuit 410, analog to digital converter circuit 414 and equalizer circuit 420 may be eliminated where the data is received as a digital data input. Equalized output 425 is stored to an input buffer 453 that includes sufficient memory to maintain a number of codewords until processing of that codeword is completed through a data detector circuit 430 and low density parity check (LDPC) decoding circuit 470 including, where warranted, multiple global iterations (passes through both data detector circuit 430 and LDPC decoding circuit 470) and/or local iterations (passes through LDPC decoding circuit 470 during a given global iteration). An output 457 is provided to data detector circuit 430.

Data detector circuit 430 may be a single data detector circuit or may be two or more data detector circuits operating in parallel on different codewords. Whether it is a single data detector circuit or a number of data detector circuits operating in parallel, data detector circuit 430 is operable to apply a data detection algorithm to a received codeword or data set. In some embodiments of the present invention, data detector circuit 430 is a Viterbi algorithm data detector circuit as are known in the art. In other embodiments of the present invention, data detector circuit 430 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 430 is used to apply the data detection algorithm to the received codeword for a first global iteration applied to the received codeword, and another data detector circuit included in data detector circuit 430 is operable apply the data detection algorithm to the received codeword guided by a decoded output accessed from a central memory circuit 450 on subsequent global iterations.

Upon completion of application of the data detection algorithm to the received codeword on the first global iteration, data detector circuit 430 provides a detector output 433. Detector output 433 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 433 is provided to a local interleaver circuit 442. Local interleaver circuit 442 is operable to shuffle sub-portions (i.e., local chunks) of the data set included as detected output and provides an interleaved codeword 446 that is stored to central memory circuit 450. Interleaver circuit 442 may be any circuit known in the art that is capable of shuffling data sets to yield a re-arranged data set. Interleaved codeword 446 is stored to central memory circuit 450.

Once LDPC decoding circuit 470 is available, a previously stored interleaved codeword 446 is accessed from central memory circuit 450 as a stored codeword 486 and globally interleaved by a global interleaver/de-interleaver circuit 484. Global interleaver/de-interleaver circuit 484 may be any circuit known in the art that is capable of globally rearranging codewords. Global interleaver/De-interleaver circuit 484 provides a decoder input 452 into LDPC decoding circuit 470. LDPC decoding circuit 470 applies an LDPC data decode algorithm to decoder input 452 to yield a decoded output 471. In cases where another local iteration (i.e., another pass through LDPC decoding circuit 470) is desired, LDPC decoding circuit 470 re-applies the data decode algorithm to decoder input 452 guided by decoded output 471. This continues until either a maximum number of local iterations is exceeded or decoded output 471 converges (i.e., completion of standard processing).

Where decoded output 471 fails to converge (i.e., fails to yield the originally written data set) and a number of local iterations through LDPC decoding circuit 470 exceeds a threshold, but an allowable number of global iterations is not yet exceeded, the resulting decoded output is provided as a decoded output 454 back to central memory circuit 450 where it is stored awaiting another global iteration through a data detector circuit included in data detector circuit 430. Prior to storage of decoded output 454 to central memory circuit 450, decoded output 454 is globally de-interleaved to yield a globally de-interleaved output 488 that is stored to central memory circuit 450. The global de-interleaving reverses the global interleaving earlier applied to stored codeword 486 to yield decoder input 452. When a data detector circuit included in data detector circuit 430 becomes available, a previously stored de-interleaved output 488 is accessed from central memory circuit 450 and locally de-interleaved by a de-interleaver circuit 444. De-interleaver circuit 444 re-arranges decoder output 448 to reverse the shuffling originally performed by interleaver circuit 442. A resulting de-interleaved output 497 is provided to data detector circuit 430 where it is used to guide subsequent detection of a corresponding data set previously received as equalized output 425.

Alternatively, where the decoded output converges (i.e., yields the originally written data set), the resulting decoded output is provided as an output codeword 472 to a de-interleaver circuit 480 that rearranges the data to reverse both the global and local interleaving applied to the data to yield a de-interleaved output 482. De-interleaved output 482 is provided to a hard decision buffer circuit 428 buffers de-interleaved output 482 as it is transferred to the requesting host as a hard decision output 429.

As yet another alternative, where decoded output 471 fails to converge (i.e., fails to yield the originally written data set), a number of local iterations through LDPC decoding circuit 470 exceeds a threshold, and a number of global iterations through data detector circuit 430 and LDPC data decoding circuit exceeds a threshold, the result of the last pass through LDPC decoding circuit 470 is provided as a decoded output 474 to FAID follower circuit 490 that applies a FAID algorithm to a collection of errors around an error floor of decoded output 474 to yield a FAID output 491. Where FAID output 491 converges (i.e., all errors are corrected), it is provides as a decoded output 492 to a de-interleaver circuit 480 that rearranges the data to reverse both the global and local interleaving applied to the data to yield a de-interleaved output 482. De-interleaved output 482 is provided to a hard decision buffer circuit 428 buffers de-interleaved output 482 as it is transferred to the requesting host as a hard decision output 429.

Alternatively, where FAID output 491 fails to converge (i.e., errors remain), FAID follower circuit 490 re-applies the FAID algorithm to yield an updated FAID output 491. This process is repeated until either FAID output 491 converges or a maximum number of iterations through FAID follower circuit 490 have occurred. Where maximum number of iterations through FAID follower circuit 490 have occurred without convergence of FAID output 491, an error is indicated.

Turning to FIG. 4b, a check node to variable node process 421 of FAID follower circuit 490 and a variable node to check node process 422 of FAID follower circuit 490 are shown. As shown, check node to variable node process 421 includes variable nodes (e.g., v) receiving messages (i.e., m1, m2) from two or more check nodes (e.g., c1, c2). In turn, the variable node calculates Φv based upon the received messages in accordance with the following equation:

$$\Phi v = r + \sum_{i=1}^{n} m_i,$$

where r is the initial soft data (LLR) for the bit or symbol position. In the example of check node to variable node process 421, n is equal to 2. At this juncture, the check node to variable node process is the same as the variable node to check node process applied by LDPC decoding circuit 470 (or any other min-sum algorithm). In the case of FAID follower circuit 490, the aforementioned result (Φv) is mapped to a finite alphabet (M) to yield an updated message to check node c3. The finite alphabet may be predetermined or may be calibrated as disclosed below in relation to FIG. 6. The mapping process may be done in accordance with the following mapping equation:

$$M(\Phi v) = \text{sign}(\Phi v) \cdot L_i \text{ if } L_i \leq |\Phi v| < L_{i+1},$$

where Li is an allowable message. Using, for example, the following allowable map (M):

$$M = \{-19.6, -14, -7, -1.4, 0, 1.4, 7, 14, 19.6\},$$

and Φv equals 1.3, then M (Φv) is equal to 0 as Φv is greater than −1.4 and less than 1.4. As another example, assuming Φv equals 5.0, then M (Φv) is equal to 1.4 as Φv is greater than 1.4 and less than 7.0.

In some embodiments of the present invention, the messages in LDPC decoding circuit 470 are five bit messages. In such a case, the messages are set forth in a thirty-one element message set below:

LDPC Message Set={$-L_{15}, -L_{14}, \ldots, -L_2, -L_1, 0, L_1, L_2, \ldots, L_1, L_2, \ldots, L_{14}, L_{15}$}.

This LDPC message set is reduced to the nine element message set (M) for use by FAID follower circuit 490 set forth below:

$$M = \{-L_{15}, -L_{10}, -L_5, -L_1, 0, L_1, L_5, L_{10}, L_{15}\}.$$

This nine element message set yields a total number of 1365 distinct alphabets that are possible.

Variable node to check node process 422, a check node (e.g., c) receives messages (i.e., m1, m2, m3) from two or more variable nodes (e.g., v1, v2, v3). In turn, the check node calculates Φc based upon the received messages in accordance with the following equation:

$$\Phi c = \prod_{i=1,2,3} \text{sign}(m_i) \cdot \min\{m_1, m_2, m_3\},$$

In the example of variable node to check node process 422, Φc is limited to a subset of M in accordance with the following equation:

$$\Phi C \in \{\pm m_1, \pm m_2, \pm m_3\} \subseteq M.$$

Figure 5A:
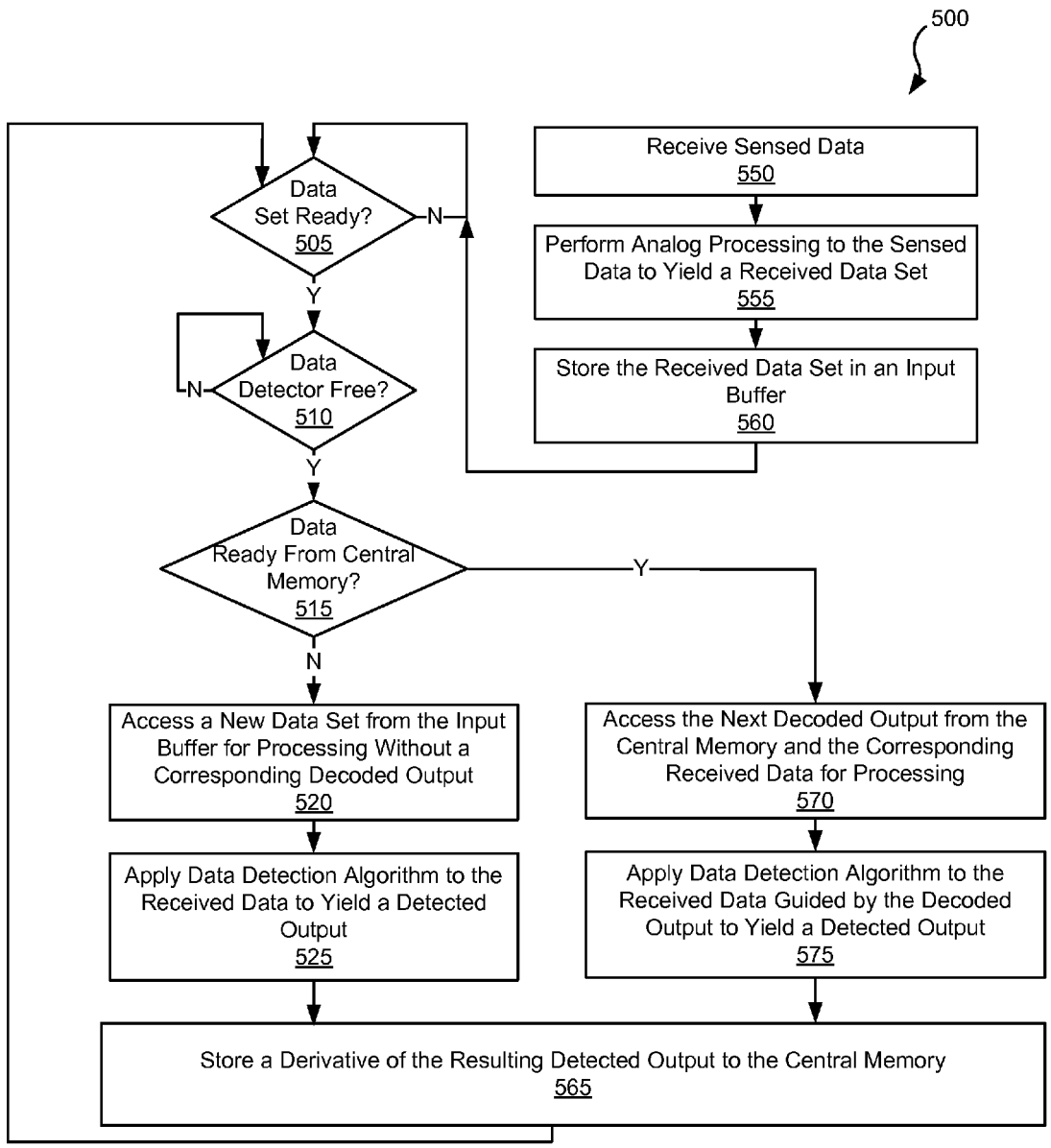
FIGS. 5a-5b are flow diagrams showing a method for data processing utilizing FAID follower decoding in accordance with one or more embodiments of the present invention.
Figure 5B:
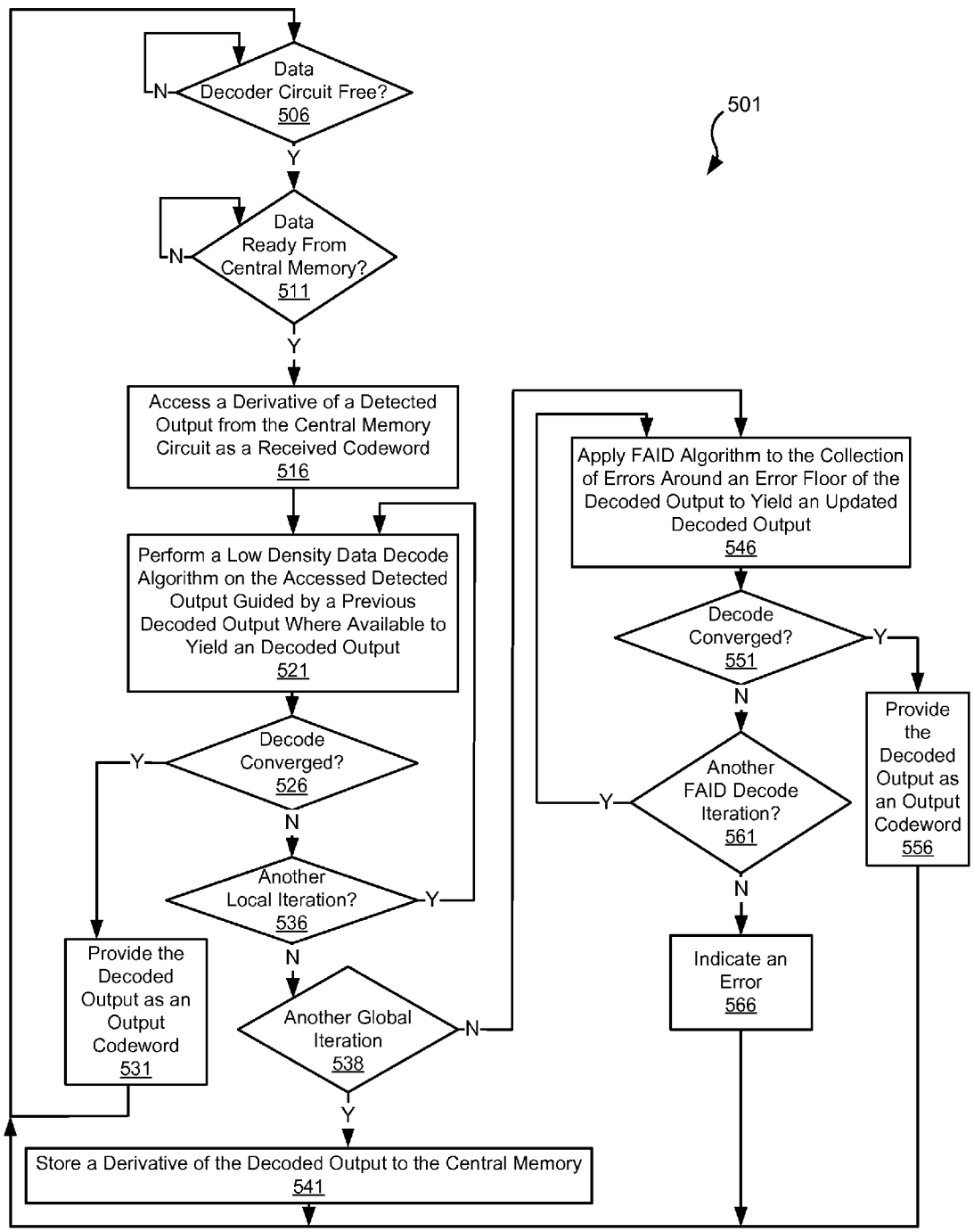

Turning to FIG. 5a-5b, flow diagrams 500, 501 show a method for data processing utilizing FAID follower decoding in accordance with one or more embodiments of the present invention. Following flow diagram 500 of FIG. 5a, sensed data is received (block 550). This data set may be derived or received from, for example, a storage medium or a communication medium. Analog processing is applied to the sensed data to yield a received data set (block 555). This analog processing may include, but is not limited to, amplification, equalization, and/or analog to digital conversion. The resulting received data set is stored to an input buffer (block 560).

It is repeatedly determined whether a data set is ready for processing (block 505). A data set may become ready for processing where either the data set was previously processed and a data decode has completed in relation to the data set and the respective decoded output is available in a central memory, or where a previously unprocessed data set becomes available in the input buffer. Where a data set is ready (block 505), it is determined whether a data detector circuit is available to process the data set (block 510).

Where the data detector circuit is available for processing (block 510), it is determined whether there is a decoded output in the central memory that is ready for additional processing (block 515). Where there is a decoded output available in the central memory (block 515), the next decoded output from the central memory is accessed along with the corresponding received data stored in the input buffer (block 570). A data detection algorithm is applied to the received data guided by the decoded output to yield a detected output (block 575). Alternatively, where data is not ready from the central memory (block 515), a new data set is accessed from the input buffer for processing without a corresponding decoded output (block 520). The data detection algorithm is applied to the received data to yield a detected output (block 525). In either case, a decoder input derived from the resulting detected output is stored to the central memory (block 565).

Turning to flow diagram 501 of FIG. 5b, a counterpart of the method described above in relation to FIG. 5a is shown. Following flow diagram 501, in parallel to the previously described data detection process of FIG. 5a, it is determined whether a data decoder circuit is available (block 506). The data decoder circuit may be, for example, a low density data decoder circuit as are known in the art. Where the data decoder circuit is available (block 506), it is determined whether a derivative of a detected output is available for processing in the central memory (block 511). Where such a data set is ready (block 511), the previously stored derivative of a detected output is accessed from the central memory and used as a received codeword (block 516).

A data decode algorithm is applied to the accessed detected output (block 521). Where a previous local iteration has been performed on the received codeword, the results of the previous local iteration (i.e., a previous decoded output) are used to guide application of the decode algorithm. In some embodiments of the present invention, the decode algorithm is a low density parity check decode algorithm.

It is then determined whether the decoded output converged (i.e., resulted in the originally written data) (block 526). Where the decoded output converged (block 526), it is provided as an output codeword (block 531). Alternatively, where the decoded output failed to converge (block 526), it is determined whether another local iteration is desired (block 536). Where another local iteration is desired (block 536), the processes of blocks 521-536 are repeated for the codeword.

Alternatively, where another local iteration is not desired (i.e., the allowable number of local iterations are exceeded) (block 536), it is determined whether another global iteration is allowed for the codeword (block 538). Where another global iteration is allowed (block 538), A derivative of the decoded output is stored to the central memory to await re-processing by the data detection algorithm (block 541).

Where another global iteration is not allowed (block 538), a FAID algorithm is applied to the collection of errors around an error floor of the decoded output to yield an updated decoded output (bock 546). Application of the FAID algorithm is performed similar to that discussed above in relation to FIG. 4b. It is determined whether all of the remaining errors have been resolved (i.e., whether the algorithm converged) (bock 551). Where the algorithm converges (block 551), the resulting decoded output is provided as an output codeword (block 556).

Alternatively, where the resulting decoded output failed to converge (block 551), it is determined whether another iteration of applying the FAID algorithm is to be applied (block 561). In some embodiments of the present invention, the maximum number of iterations of the FAID algorithm is one hundred. Where another iteration of the FAID algorithm is allowed (block 561), the processes of blocks 546-561 are repeated. Alternatively, where no additional iterations of the FAID algorithm are to be applied (block 561), an error is indicated (block 566).

Figure 6:
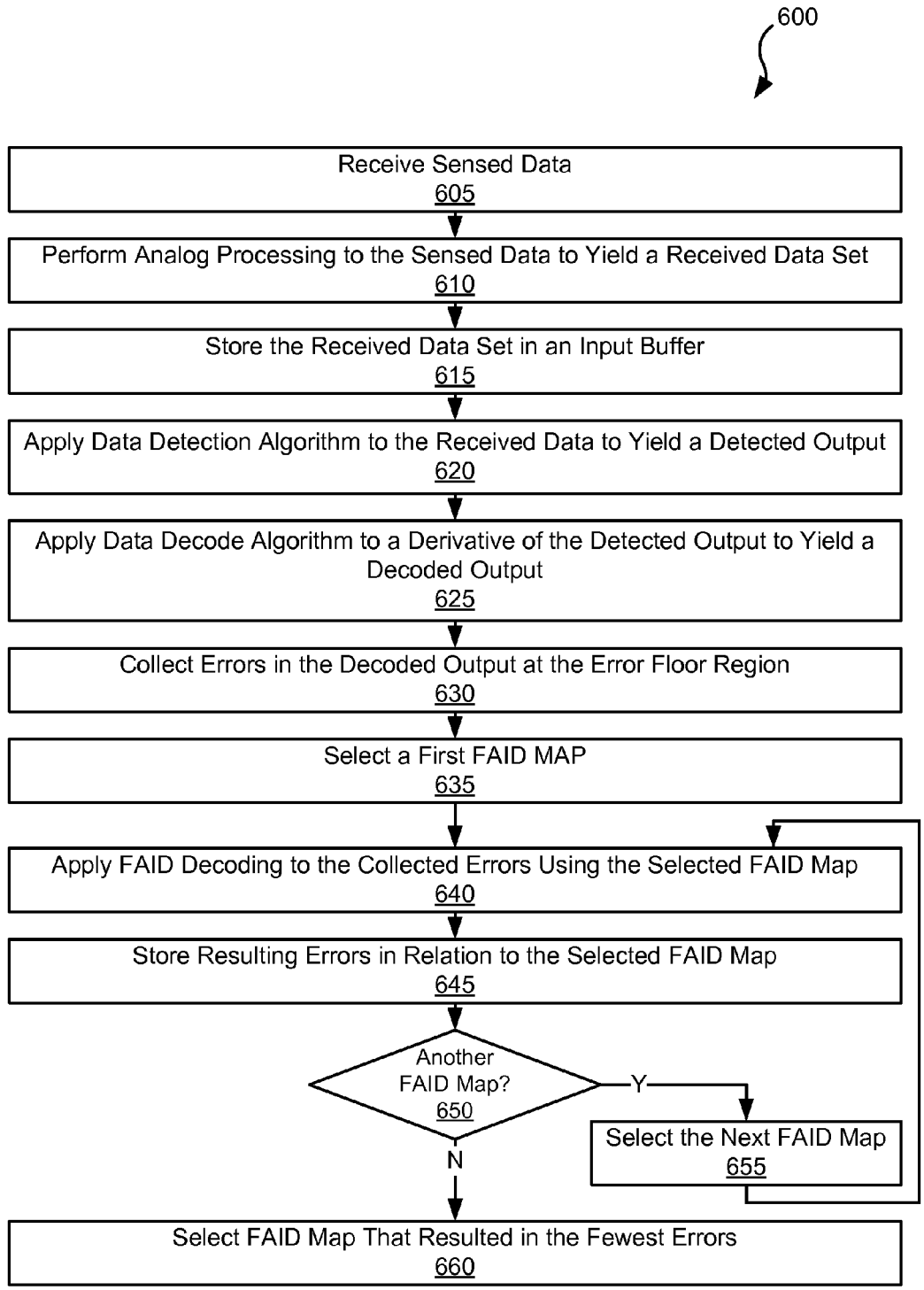
FIG. 6 is a flow diagram showing a method for determining a FAID map in accordance with various embodiments of the present invention.

Turning to FIG. 6, a flow diagram 600 shows a method for determining a FAID map (M) in accordance with various embodiments of the present invention. The resulting FAID map may be used in place of the map (M) used in the data processing system discussed in relation to FIGS. 4a-4b and the methods discussed in relation to FIGS. 5a-5b. Following flow diagram 600, data previously stored to a storage medium and data is sensed from the storage medium resulting in the reception of sensed data (block 605). Analog processing is applied to the sensed data to yield a received data set (block 610). This analog processing may include, but is not limited to, amplification, equalization, and/or analog to digital conversion. The resulting received data set is stored to an input buffer (block 615).

A data detection algorithm is applied to the received data to yield a detected output (block 620). The data detection algorithm may be, but is not limited to, a maximum a posteriori data detection algorithm or a Viterbi data detection algorithm as are known in the art. Based upon the disclosure provided herein, one of ordinary skill in the art will recognize a variety of data detection algorithms that may be used in relation to different embodiments of the present invention.

A data decode algorithm is applied to a decode input derived from the detected output to yield a decoded output (block 625). In some embodiments of the present invention, the data decode algorithm is a min-sum based data decode algorithm such as, for example, a low density parity check decode algorithm. Based upon the disclosure provided herein, one of ordinary skill in the art will recognize other data decode algorithms that may be used in relation to different embodiments of the present invention. Errors near the error floor region in the decoded output are collected (block 630).

A first possible FAID map is selected (block 635), and a FAID algorithm using the selected FAID map is applied to the collected errors (block 640). The errors resulting from use of the selected FAID map are stored (block 645). It is determined whether another possible FAID map remains to be tested (block 650). Where another possible FAID map remains to be tested (block 650), the next FAID map is selected (block 655) and the processes of blocks 640-650 are repeated for the next FAID map. Where a thirty-one element map used by LDPC decoding circuit 470 is remapped as part of FAID processing to a nine element map, a total of 3165 different alphabets are tested. The following table shows the number of possible alphabets to be tested depending upon the number of elements in the FAID map:

| FAID Elements | Number of FAIDs |
|---|---|
| 3 | 15 |
| 5 | 105 |
| 7 | 455 |
| 9 | 1365 |
| 11 | 3003 |
| 13 | 5005 |
| 15 | 6435 |
| 17 | 6435 |
| 19 | 5005 |
| 21 | 3003 |
| 23 | 1365 |
| 25 | 455 |
| 27 | 105 |
| 29 | 15 |
| 31 | 1 |

It has been found that FAID maps with a number of elements between nine and seventeen provide the best performance. Alternatively, where no additional FAID map remains to be tested (block 650), the FAID map that results in the fewest errors is selected for use in processing data (block 660).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the inven-

What is claimed is:

1. A data processing system, the data processing system comprising:
   a first data decoding circuit operable to apply a low density parity check decoding algorithm to a decoder input to yield a first decoded output; and
   a second data decoding circuit coupled to the first data decoding circuit and a data output circuit, wherein the second data decoding circuit is operable to apply a finite alphabet iterative decoding algorithm to the first decoded output to yield a second decoded output, and wherein the second decoded output is only provided to one or both of the data output circuit or the second data decoding circuit.

2. The data processing system of claim 1, wherein the finite alphabet iterative decoding algorithm is operable to map a variable node value into a defined map including a number of elements.

3. The data processing system of claim 2, wherein the number of elements is a second finite number of elements; wherein the low density parity check decoding algorithm allows a first finite number of elements; wherein the finite alphabet iterative decoding algorithm allows the second finite number of elements; and wherein the second finite number is less than the first finite number.

4. The data processing system of claim 3, wherein the second finite number is less than half of the first finite number.

5. The data processing system of claim 3, wherein the first finite number is thirty-one, and wherein the second finite number is between nine and seventeen.

6. The data processing system of claim 5, wherein the second finite number is nine.

7. The data processing system of claim 2, wherein the defined map is generated by applying the finite alphabet iterative decoding algorithm to the first decoded output using a first instance of the defined map to yield a first result, applying the finite alphabet iterative decoding algorithm to the first decoded output using a second instance of the defined map to yield a second result, and selecting one of the first instance of the defined map and the second instance of the defined map based upon a comparison of the first result and the second result.

8. The data processing system of claim 7, wherein the number of elements in the defined map is nine; and wherein applying the finite alphabet iterative decoding algorithm to the first decoded output is repeated for 3165 different instances of the defined map to yield corresponding results, and selecting the instance associated with the best of the corresponding results.

9. The data processing system of claim 2, wherein the defined map is generated by applying the finite alphabet iterative decoding algorithm to a collection of errors around an error floor of the first decoded output using a first instance of the defined map to yield a first result, applying the finite alphabet iterative decoding algorithm to the collection of errors around the error floor of the first decoded output using a second instance of the defined map to yield a second result, and selecting one of the first instance of the defined map and the second instance of the defined map based upon a comparison of the first result and the second result.

10. The data processing system of claim 1, the data processing system further comprises:
    a data detector circuit operable to apply a data detection algorithm to a detector input to yield a detected output; and
    wherein the decoder input is derived from the detector output.

11. The data processing system of claim 10, wherein the data detection algorithm is selected from a group consisting of: a maximum a posteriori data detection algorithm, and a Viterbi data detection algorithm.

12. The data processing system of claim 1, wherein the system is implemented as an integrated circuit.

13. The data processing system of claim 1, wherein the data processing system is incorporated in a device selected from a group consisting of: a storage device, and a communication device.

14. A method for data processing, the method comprising:
    applying a low density parity check decoding algorithm by a low density parity check decoder circuit to a decoder input to yield a first decoded output;
    applying a finite alphabet iterative decoding algorithm by a finite alphabet iterative decoding circuit to the first decoded output to yield a second decoded output; and
    providing the second decoded output to one or both of a data output circuit or the finite alphabet iterative decoding circuit.

15. The method of claim 14, wherein the finite alphabet iterative decoding algorithm is operable to map a variable node value into a defined map including a number of elements.

16. The method of claim 15, wherein the number of elements is a second finite number of elements; wherein the low density parity check decoding algorithm allows a first finite number of elements; wherein the finite alphabet iterative decoding algorithm allows the second finite number of elements; and wherein the second finite number is less than the first finite number.

17. The method of claim 16, wherein the first finite number is thirty-one, and wherein the second finite number is nine.

18. The method of claim 15, wherein the method further comprises:
    generating the defined map by applying the finite alphabet iterative decoding algorithm to the first decoded output using a first instance of the defined map to yield a first result, applying the finite alphabet iterative decoding algorithm to the first decoded output using a second instance of the defined map to yield a second result, and selecting one of the first instance of the defined map and the second instance of the defined map based upon a comparison of the first result and the second result.

19. The method of claim 18, wherein the second finite number is nine, and wherein applying the finite alphabet iterative decoding algorithm to the first decoded output is repeated for 3165 different instances of the defined map to yield corresponding results, and selecting the instance associated with the best of the corresponding results.

20. The method of claim 15, wherein the method further comprises:
    selecting a collection of errors around an error floor of the first decoded output; and
    generating the defined map by applying the finite alphabet iterative decoding algorithm to the collection of errors around the error floor of the first decoded output using a first instance of the defined map to yield a first result, applying the finite alphabet iterative decoding algorithm to the collection of errors around the error floor of the first decoded output using a second instance of the defined map to yield a second result, and selecting one of the first instance of the defined map and the second instance of the defined map based upon a comparison of the first result and the second result.

\* \* \* \* \*